(12) United States Patent
Sakai

(10) Patent No.: US 6,381,120 B2
(45) Date of Patent: Apr. 30, 2002

(54) MOUNTING ARRANGEMENT FOR MULTILAYER ELECTRONIC PART

(75) Inventor: Norio Sakai, Moriyama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/757,959

(22) Filed: Jan. 10, 2001

Related U.S. Application Data

(62) Division of application No. 09/372,547, filed on Aug. 11, 1999, now Pat. No. 6,236,558.

(30) Foreign Application Priority Data

Aug. 25, 1998 (JP) ............................................. 10-238827

(51) Int. Cl.$^7$ ............................ H01G 4/06; H01G 4/005
(52) U.S. Cl. ................. 361/321.2; 361/303; 361/301.4; 361/306.3
(58) Field of Search ................................. 361/303, 302, 361/301.4, 306.1, 306.3, 309, 321.2; 338/21; 333/182, 184, 185

(56) References Cited

U.S. PATENT DOCUMENTS

| | | | | |
|---|---|---|---|---|
| 4,889,760 A | * | 12/1989 | Kippenberg et al. | |
| 4,945,322 A | * | 7/1990 | Okumura | 333/184 |
| 5,200,026 A | * | 4/1993 | Okabe | 216/48 |
| 5,774,340 A | * | 6/1998 | Chang et al. | 361/771 |
| 6,171,946 B1 | * | 1/2001 | Tsukamoto | 438/623 |

* cited by examiner

*Primary Examiner*—Anthony Dinkins
(74) *Attorney, Agent, or Firm*—Ostrolenk, Faber, Gerb & Soffen, LLP

(57) ABSTRACT

A chip capacitor includes a multilayer body composed of a plurality of stacked sheet layers made of ceramics; capacitor electrodes and via hole electrodes disposed inside the multilayer body; and outer electrodes formed on only main surfaces of the multilayer body such that they are electrically connected to the capacitor electrodes via the via hole electrodes. Some of the capacitor electrodes are electrically connected by the via hole electrodes, and the other capacitor electrodes are electrically connected by other via hole electrodes.

11 Claims, 5 Drawing Sheets

MOUNTING ARRANGEMENT FOR MULTILAYER ELECTRONIC PART

This is a division of application Serial No. 09/372,547, filed Aug. 11, 1999. now U.S. Pat. No. 6,236,558

BACKGROUND OF THE INVENTION

1. Field of the Invention

The present invention relates to a multilayer electronic part, a method of producing the multilayer electronic part, and more particularly, to a multilayer electronic part (and a method of producing same) in which a plurality of outer electrodes are disposed on only the main surfaces of a multilayer body, and an end face of the multilayer body serves as a mounting surface for mounting the part on a mounting substrate.

2. Description of the Related Art

Multilayer electronic parts which utilize chip capacitors and chip inductors are essential in obtaining miniaturization and higher performance of electronic devices. There is a demand for increased density and performance of such devices and, in response to this demand, a chip capacitor has been proposed in Japanese Patent Publication No. 57-56217.

FIG. 5 is a perspective view of such a chip capacitor 50. Chip capacitor 50 comprises a multilayer body 52 composed of a plurality of stacked sheet layers 51 made of ceramics; inner electrodes 53 made of copper or the like inside the multilayer body 52; and outer electrodes 54 disposed on an end face of the multilayer body 52. In this case, the inner electrodes 53 are connected to the outer electrodes 54 by lead electrodes 55 formed at the ends of the inner electrodes 53. Although not shown, the end face of the multilayer body 52 where the outer electrodes 54 are disposed serves as a mounting surface of the chip capacitor 50, and the chip capacitor 50 is mounted on a printed board by connecting the outer electrodes 54 to a pad on the printed board using solder or the like.

In multilayer electronic parts employing the above-described conventional chip capacitor, however, since the outer electrodes are formed on the end face of the multilayer body, it is necessary, in producing the chip capacitor, to cut a mother multilayer body into individual multilayer bodies and to subsequently form outer electrodes on an end face, which is the cutting face, of the individual multilayer bodies.

As a result, the following problems arise:

1) The production process is complicated and, therefore, the production cost is high.

2) The cutting surface is not sufficiently flat, and it is difficult as a result to provide a narrow a space between the outer electrodes.

3) It is also difficult to measure the characteristics of individual multilayer electronic parts in the assembled state.

SUMMARY OF THE INVENTION

To overcome the above described problems, preferred embodiments of the present invention provide a multilayer electronic part that allows low production costs and narrowing of the space between outer electrodes, and a method of producing the multilayer electronic part.

One embodiment of the present invention provides a multilayer electronic part comprising: a multilayer body composed of a plurality of stacked sheet layers made of ceramics, said plurality of stacked sheet layers defining a stacking direction substantially perpendicular to a main surface of each of said plurality of stacked sheet layers; a plurality of inner electrodes and connecting means provided inside said multilayer body; and a plurality of outer electrodes disposed on only a main surface of said multilayer body so as to be electrically connected to any of said inner electrodes via said connecting means, and said multilayer body further comprising a mounting surface so that said multilayer body is mounted at said mounting surface, said mounting surface being substantially parallel to said stacking direction.

Another embodiment of the present invention provides a method of producing a multilayer electronic part comprising the steps of: preparing a plurality of mother sheet layers made of ceramics; forming inner electrodes and connecting means on any one of said plurality of mother sheet layers; forming a mother multilayer body by stacking and press-bonding said plurality of mother sheet layers; forming an outer electrode on only a main surface of said mother multilayer body so as to be electrically connected to any one of said inner electrodes via said connecting means; cutting said mother multilayer body into a multilayer body having said inner electrode, said outer electrode, and said connecting means; and baking said mother multilayer body or said multilayer body.

According to the multilayer electronic part of the present invention, since the outer electrode is disposed on only the main surface of the base plate, it can be formed such that the mother multilayer body is not yet cut in the process of producing the multilayer electronic part.

According to the method of producing a multilayer electronic part of the present invention, since the method includes the step of forming outer electrodes on the main surface of the mother multilayer body, it is possible to narrow the space between the outer electrodes.

Further objects, features, and advantages of the present invention will become apparent from the following description of the preferred embodiments with reference to the attached drawings.

DESCRIPTION OF THE PREFERRED EMBODIMENTS

Figure 1:
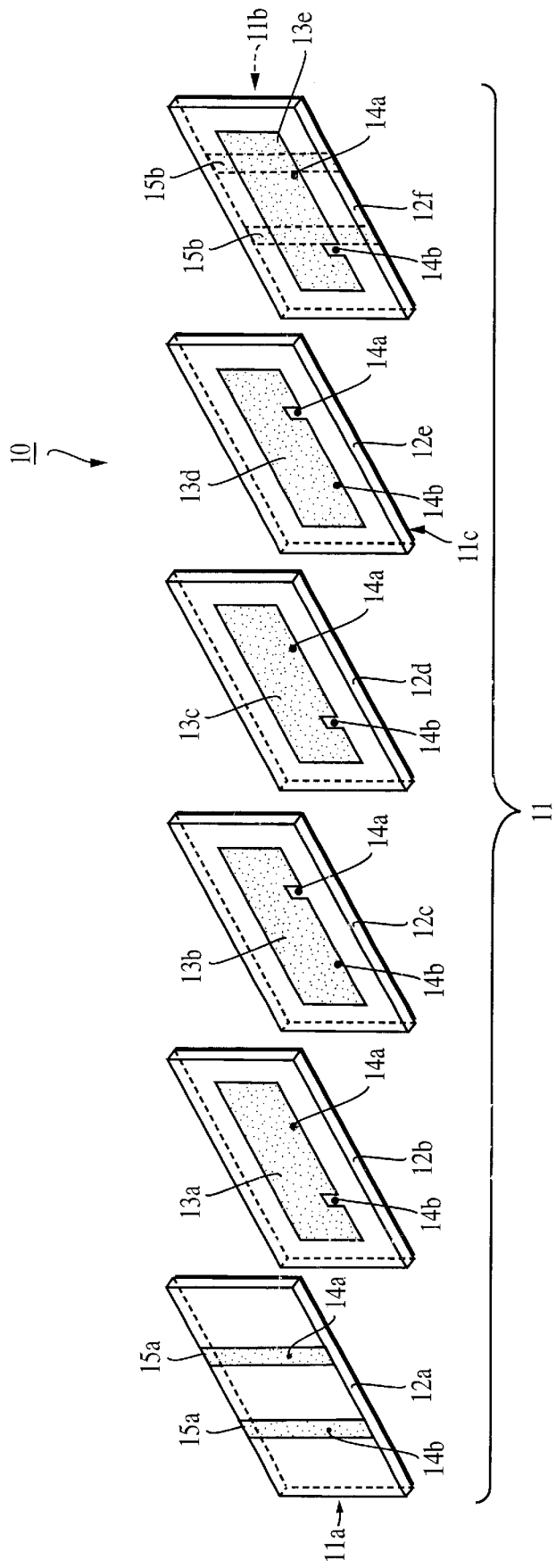
FIG. 1 is an exploded perspective view of a multilayer electronic part according to a first embodiment of the present invention.

FIG. 1 is an exploded perspective view showing a multilayer electronic part according to a first embodiment of the present invention. A chip capacitor 10 is a multilayer electronic component and includes a multilayer body 11 composed of a plurality of stacked sheet layers 12a to 12f made of ceramics. The chip capacitor also includes capacitor electrodes 13a to 13e serving as inner electrodes disposed within the multilayer body 11; via hole electrodes 14a 14b serving as connectors; and outer electrodes 15a and 15b disposed on only the main surfaces 11a and 11b of the multilayer body 11 such that they are electrically connected to the capacitor electrodes 13a and 13e via the via hole electrodes 14a.

In this case, the capacitor electrodes 13a, 13c, and 13e, and the capacitor electrodes 13b and 13d are electrically connected via the via hole electrodes 14a, and 14b, respectively.

Figure 2:
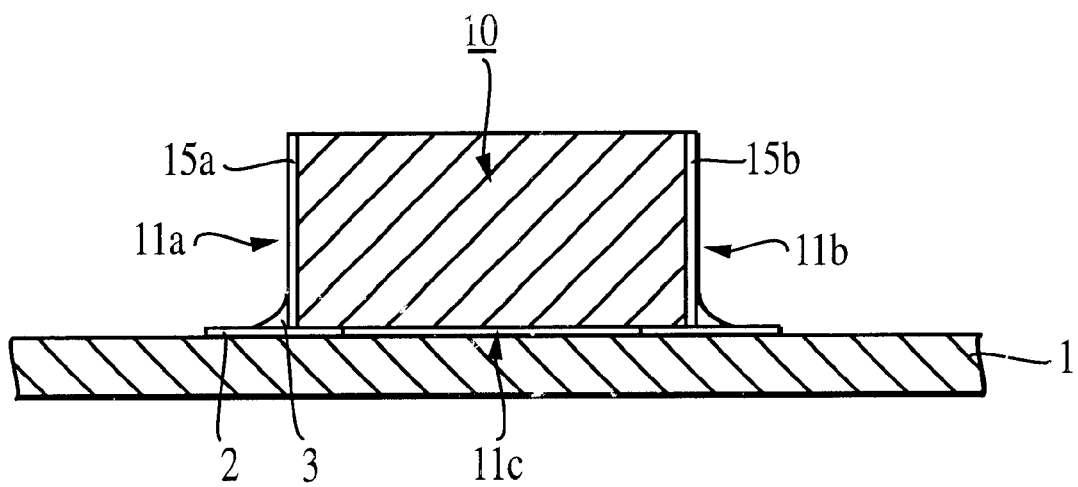
FIG. 2 is a cross-sectional view showing the multilayer electronic part of FIG. 1 mounted on a mounting substrate.

FIG. 2 is a cross-sectional view showing the chip capacitor 10 of FIG. 1 mounted on a mounting substrate. The chip capacitor 10 is mounted on a printed board 1, which serves as a mounting substrate, by connecting the outer electrodes 15a and 15b to a wiring pattern 2 on the printed board 1 using, e.g., solder 3. A lengthwise end face 11c of the multilayer body 11 of the chip capacitor 10 is used as a mounting surface.

FIGS. 3A to 3D are cross-sectional views which will be used in explaining a method of producing the chip capacitor 10 shown in FIG. 1.

Figure 3A:
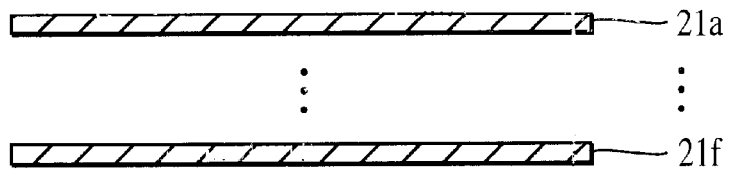
FIGS. 3A to 3D are cross-sectional views illustrating a method of producing the multilayer electronic part shown in FIG. 1.

First, a plurality of mother sheet layers 21a to 21f made of ceramics are prepared (FIG. 3A).

Figure 3B:
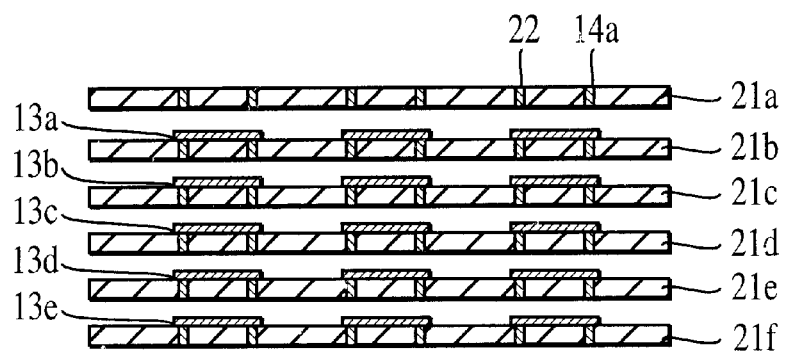
Figure 3C:
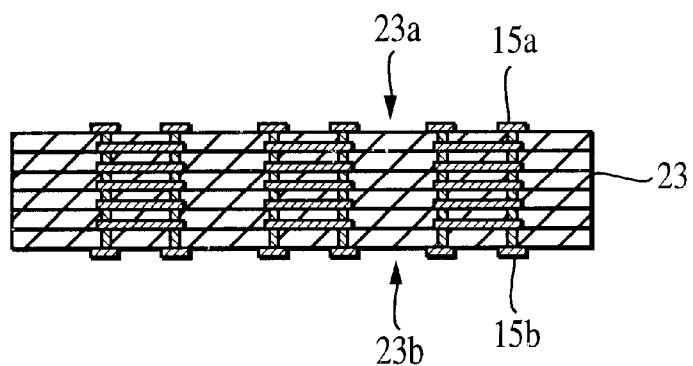

Next, through holes 22 are formed in the mother sheet layers 21 to 21f by way of, for example, punching, and the capacitor electrodes 13a to 13e are formed on the mother sheet layers 21b to 21f, respectively, for example by screen-printing conductive paste thereon. Further, the via hole electrodes 14a, 14b are formed by disposing conductive paste in the through holes 22 (FIG. 3B).

Figure 3D:
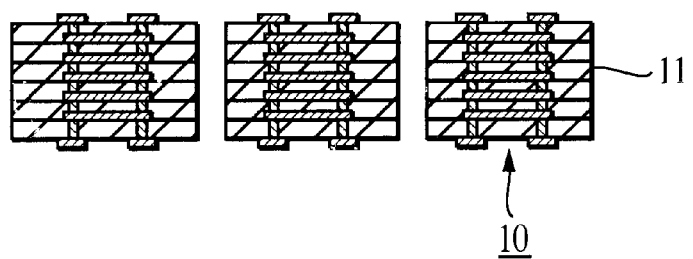

After a mother multilayer body 23 is formed by laying the plurality of mother sheet layers 21a to 21f on top of one another, conductive paste is screen-printed on only the main surfaces 23a and 23b of the mother multilayer body 23 such that the outer electrodes 15a and 15b are formed thereon. In this case, the capacitor electrodes 13a to 13e on the mother sheet layers 21b to 21f, and the outer electrodes 15a and 15b on the main surfaces 23a and 23b of the mother multilayer body 23 are connected via the via hole electrodes 14a. Since the mother multilayer body 23 has not yet been subjected to cutting, the main surfaces 23a and 23b thereof with outer electrodes 15a and 15b have a high level of flatness Next, the mother multilayer body 23 provided with the capacitor electrodes 13a to 13e therein and the outer electrodes 15a and 15b on the main surfaces 23a and 23b thereof, is cut into blocks, each of which is to become a separate multilayer body 11. Subsequently, the multilayer body 11, the capacitor electrodes 13a to 13e, the via hole electrodes 14a, 14b and the outer electrodes 15a and 15b are baked together (FIG. 3D).

According to the above-described production method, the chip capacitor 10 is completed, which has the capacitor electrodes 13a to 13e inside the multilayer body 11, and the outer electrodes 15a and 15b formed on only the main surfaces 11a and 11b of the multilayer body 11.

Figure 4:
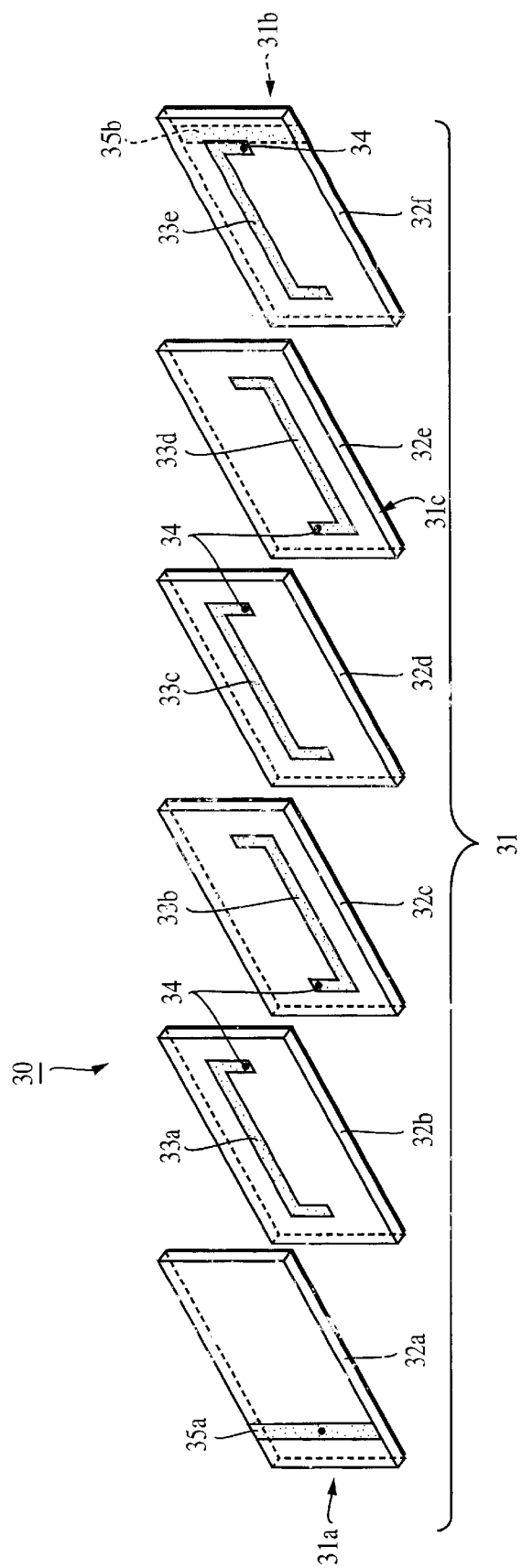
FIG. 4 is an exploded perspective view showing a multilayer electronic part according to a second embodiment of the present invention.
Figure 5:
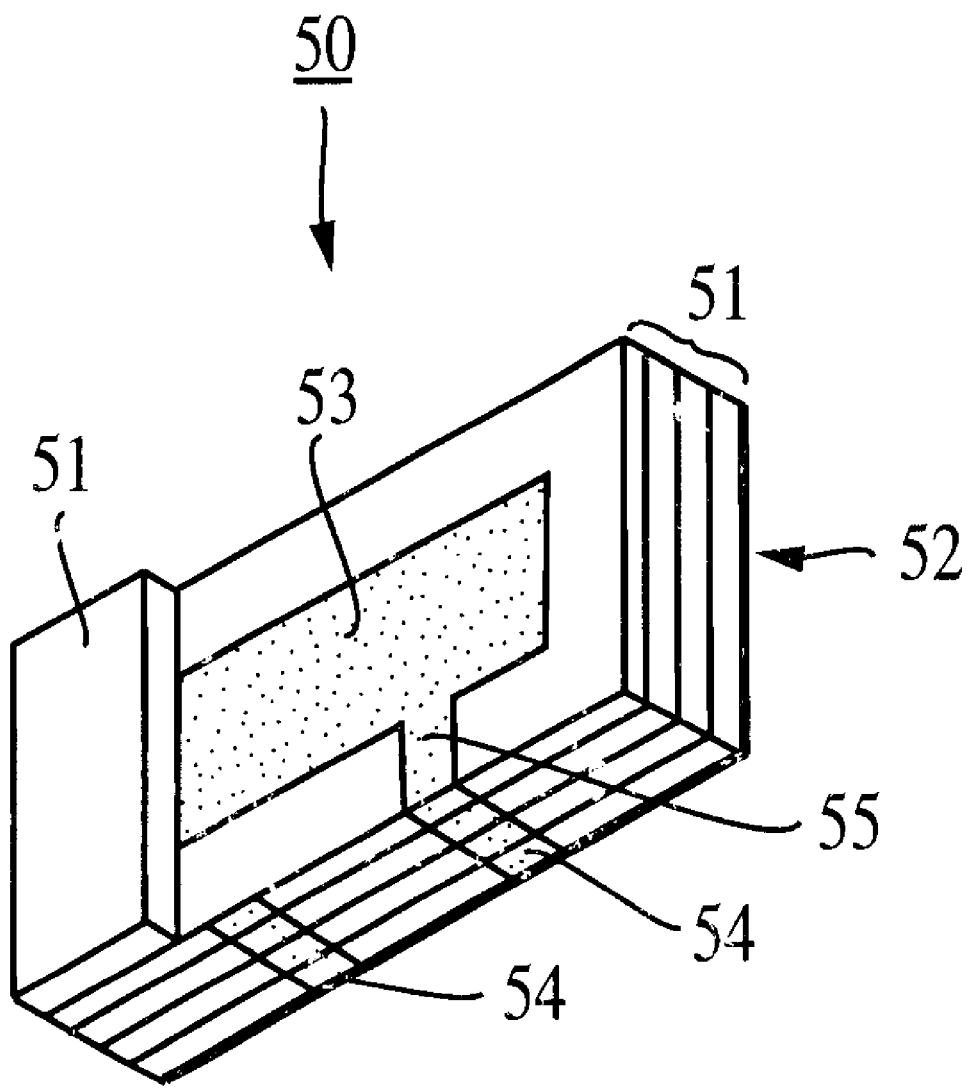
FIG. 5 is a sectional view of a prior art chip capacitor.

FIG. 4 is an exploded perspective view of a multilayer electronic part according to a second embodiment of the present invention. A chip inductor 30 is a multilayer electronic component and includes a multilayer body 31 composed of a plurality of stacked sheet layers 32a to 32f made of ceramics; inductor electrodes 33a to 33e serving as inner electrodes disposed inside the multilayer body 31; via hole electrodes 34 serving as connectors; and outer electrodes 35a and 35b formed on only the main surfaces 31a and 31b of the multilayer body 31 such that they are electrically connected to any of the inductor electrodes 33a and 33e via the via hole electrodes 34.

In this case, the inductor electrodes 33a and 33b, the inductor electrodes 33b and 33c, the inductor electrodes 33c and 33d, and the inductor electrodes 33d and 33e are electrically connected, respectively, by the via hole electrodes 34 formed at one end of the inductor electrodes 33a and 33e.

Although not shown, the chip inductor 30 is mounted on a printed board (serving as a mounting substrate) by connecting the outer electrodes 35a and 35b to a wiring pattern on the printed board (e.g., using solder). A lengthwise end face 31c of the multilayer body 31 of the chip inductor 30 is used as a mounting surface, in a manner similar to that of the chip capacitor 10 of the first embodiment shown in FIG. 1.

The chip inductor 30 is produced using a method substantially similar to the production method of the chip capacitor 10 illustrated in FIGS. 3A to 3D.

While a chip capacitor or a chip inductor is used as the multilayer electronic part in the above embodiments, the present invention is also applicable to, for example, a chip resistor, a condenser (capacitor) array part, an inductor array part, or a resistor array part having a plurality of condensers, a plurality of inductors, and/or a plurality of resistors formed inside a multilayer body, and an LCR composite part having a condenser, an inductor, and a resistor formed inside a multilayer body.

While the mother multilayer body is cut into blocks serving as multilayer bodies before the multilayer body, the inner electrodes, the connectors, and the outer electrodes are baked together in the above-described production method, it may alternatively be cut into blocks after being baked together.

According to the multilayer electronic part of the present invention, since outer electrodes are formed on only the main surfaces of the base plate, they can be formed before the mother multilayer body is cut in the process of producing the multilayer electronic part. This makes it possible to simplify the production process and to reduce the production cost. As a result, it is possible to achieve a low-cost multilayer electronic part.

In accordance with the invention, the characteristics of individual multilayer electronic parts can be measured when the parts are combined in an assembly and, therefore, inspection can be completed in a short time, and the time necessary for the production process can be reduced.

According to the method of producing a multilayer electronic part of the present invention, the step of forming outer electrodes on the main surfaces of the mother multilayer body results in a high level of flatness before cutting and, therefore, it is possible to narrow any space between the outer electrodes, thereby reducing the size of the multilayer electronic parts produced according to the method.

Furthermore, since the outer electrodes can be formed precisely, it is possible to improve the yield of multilayer electronic parts, and to thereby reduce the costs thereof.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A mounting arrangement for a multilayer electronic part, comprising:

a printed circuit board;

a multilayer body including a plurality of stacked ceramic sheet layers, each layer having spaced apart opposing main surfaces and being stacked in a direction which is substantially perpendicular to the main surfaces of the layers, the multilayer body including first and second opposing main outer surfaces defined by one of the opposing main surfaces of each outermost stacked ceramic sheet layer;

a plurality of inner electrodes disposed on at least some of the main surfaces of the ceramic sheet layers;

a plurality of connectors disposed within the multilayer body, the connectors electrically coupling respective inner electrodes; and a plurality of outer electrodes, at least one of the outer electrodes disposed on each main outer surface of the multilayer body, each of the outer electrodes being electrically connected to at least one of the inner electrodes via at least one of the connectors;

wherein each ceramic sheet layer includes at least one end face disposed between the spaced apart opposing main surfaces, said ceramic sheet layers being stacked such that said end faces form a mounting surface oriented substantially in the stacking direction;

wherein the outer electrodes are sized and shaped to provide an electrical connection with a printed circuit board when the mounting surface is oriented proximate to the printed circuit board; and wherein said multilayer body is disposed proximate to said printed circuit board with said at least one of the outer electrodes being electrically connected to a wiring pattern on said printed board.

2. The mounting arrangement of claim 1, wherein each connector includes an aperture extending between main surfaces of a corresponding one of the ceramic sheet layers, the aperture containing a conductive material which provides an electrical connection from one of the inner electrodes, through the ceramic sheet layer, to at least one of (i) another inner electrode; and (ii) one of the outer electrodes.

3. The mounting arrangement of claim 2, wherein each ceramic sheet layer, having one of the inner electrodes, includes at least one connector operable to electrically couple said one of the inner electrodes to at least one of (i) another inner electrode of another ceramic sheet layer; and (ii) one of the outer electrodes.

4. The mounting arrangement of claim 3, wherein at least one of the ceramic sheet layers, having one of the inner electrodes, includes at least one connector which does not electrically couple said one of the inner electrodes to any other electrode.

5. The mounting arrangement of claim 4, comprising N ceramic sheet layers, N being a positive integer, each ceramic sheet layer being designatable as an n-th ceramic sheet layer, n=0, 1, 2, 3, . . . N, the n=0 and n=N ceramic sheet layers being the outermost ceramic sheet layers, wherein substantially all of the ceramic sheet layers, other than the outermost ceramic sheet layers, include:

one of the inner electrodes disposed on a main surface thereof;

at least one first connector operable to electrically couple said one of the inner electrodes to another inner electrode of a ceramic sheet layer which is at least one of (i) the (n+2)th layer, and (ii) the (n−2)th layer; and at least one second connector which electrically couples together electrodes of ceramic sheet layers that are directly adjacent to said ceramic sheet layer having said one of the inner electrodes.

6. The mounting arrangement of claim 5, wherein each of the outermost ceramic sheet layers include at least one connector operable to electrically couple the outer electrode thereof to the inner electrode of a directly adjacent ceramic sheet layer.

7. The mounting arrangement of claim 6, wherein the ceramic sheet layers form a capacitor.

8. The mounting arrangement of claim 3, wherein substantially all of the ceramic sheet layers, other than the outermost ceramic sheet layers, include:

one of the inner electrodes disposed on a main surface thereof;

at least one first connector operable to electrically couple together inner electrodes of ceramic sheet layers that are directly adjacent to said ceramic sheet layer having said one of the inner electrodes.

9. The mounting arrangement of claim 8, wherein each of the outermost ceramic sheet layers include at least one connector operable to electrically couple the outer electrode thereof to the inner electrode of a directly adjacent ceramic sheet layer.

10. The mounting arrangement of claim 8, wherein each of the inner electrodes are in the form of strip lines, each strip line forming a portion of a coil, the multilayer electronic part forming an inductor.

11. The mounting arrangement of claim 1, wherein each of the ceramic sheet layers is a parallelepiped, end faces thereof defining respective thicknesses.

* * * * *